(12) United States Patent
Hirao

(10) Patent No.: US 7,217,353 B2
(45) Date of Patent: May 15, 2007

(54) METHOD AND APPARATUS FOR PLATING SUBSTRATE

(75) Inventor: Shuji Hirao, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 492 days.

(21) Appl. No.: 10/624,564

(22) Filed: Jul. 23, 2003

(65) Prior Publication Data

US 2004/0079646 A1    Apr. 29, 2004

(30) Foreign Application Priority Data

Jul. 25, 2002    (JP) .............................. 2002-216344

(51) Int. Cl.
C25D 5/00 (2006.01)
C25D 5/02 (2006.01)
C25D 5/34 (2006.01)
C23C 28/02 (2006.01)

(52) U.S. Cl. ...................... 205/118; 205/123; 205/143; 205/184; 205/205

(58) Field of Classification Search ................ 427/240, 427/241; 205/123, 143, 184, 205, 118
See application file for complete search history.

(56) References Cited

U.S. PATENT DOCUMENTS 6,001,234 A * 12/1999 Batz et al. .................. 205/123
6,140,744 A * 10/2000 Bran ........................... 310/346
6,344,129 B1 * 2/2002 Rodbell et al. .............. 205/291
6,551,487 B1 * 4/2003 Reid et al. ................... 205/137
6,610,189 B2 * 8/2003 Wang et al. ................... 205/88
2002/0112964 A1 * 8/2002 Gandikota et al. .......... 205/118

FOREIGN PATENT DOCUMENTS

| JP | 2001-049495 | | 2/2001 |
| JP | 2001316869 A | * | 11/2001 |
| JP | P2001-316869 A | | 11/2001 |
| JP | 2002-129385 A | | 5/2002 |

OTHER PUBLICATIONS

Chinese Office Action Issued Dec. 22, 2006 for Corresponding Chinese Patent Application 200510070437.3.

* cited by examiner

*Primary Examiner*—Edna Wong
(74) *Attorney, Agent, or Firm*—McDermott Will & Emery LLP

(57) ABSTRACT

After bubbles adsorbed to a substrate are removed by rotating the substrate in a plating solution at a higher speed or after the wettability of the surface of the substrate to be plated is improved before the substrate is immersed in the plating solution, the substrate is rotated in the plating solution at a lower speed so that a plating process is performed with respect to the substrate.

16 Claims, 11 Drawing Sheets

FIG. 1C [High-Speed-Rotation Wafer Debubbling Step]

FIG. 4D [High-Speed-Rotation Wafer Debubbling Step]

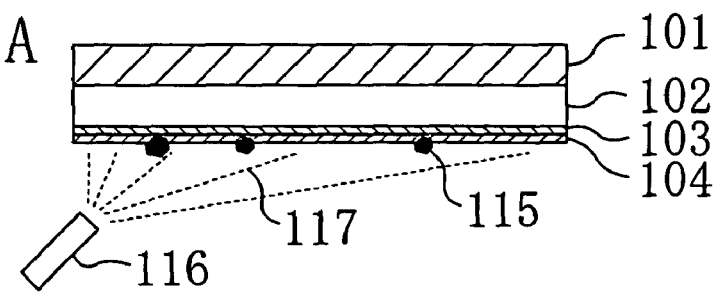
FIG. 5A
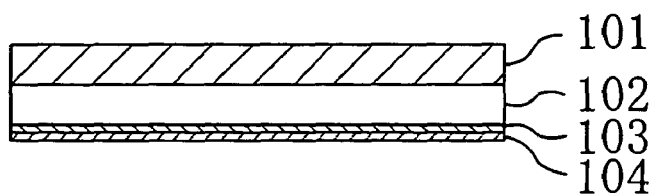
FIG. 5B
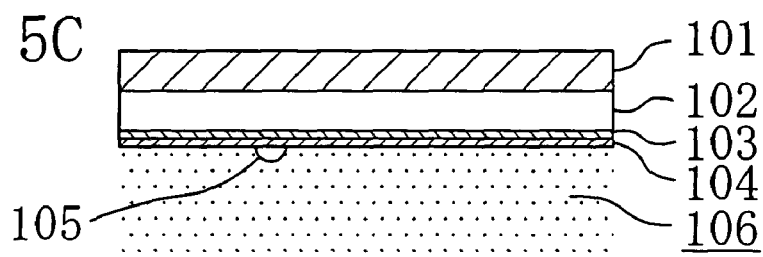
FIG. 5C
FIG. 5D [High-Speed-Rotation Wafer Debubbling Step]
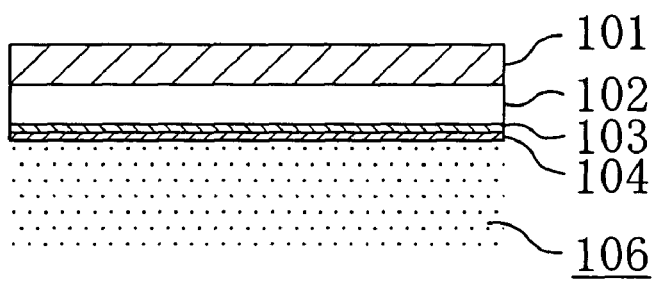
FIG. 5E
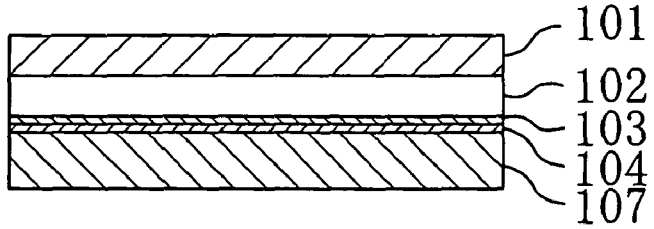

FIG. 6D [High-Speed-Rotation Wafer Debubbling Step]

US 7,217,353 B2

METHOD AND APPARATUS FOR PLATING SUBSTRATE

BACKGROUND OF THE INVENTION

The present invention relates to a method and apparatus for plating a substrate and, more particularly, to a technology for forming wiring and the like by electrolytic plating.

As a conventional wiring material for an LSI formed on a semiconductor substrate made of silicon, aluminum has been used primarily. As semiconductor integrated circuits have increased in the degree of integration and in operating speed in recent years, however, copper having lower electric resistance than aluminum and high resistance to electromigration (EM) has received attention as a wiring material. Examples of a method for forming a copper film include an electrolytic plating method as disclosed in, e.g., Japanese Laid-Open Patent Publication No. 2001-316869.

Referring to the drawings, a description will be given herein below to a conventional method for plating a substrate by electrolytic plating.

FIGS. 10A to 10C are schematic diagrams illustrating the individual process steps of the conventional method for plating a substrate.

First, as shown in FIG. 10A, a substrate 11 held in a horizontal state by a substrate holding mechanism 12 is immersed in a plating solution 10 in circulation. Then, the substrate 11 is rotated together with the substrate holding mechanism 12 at a speed of rotation of 30 rpm by using a control device (not shown). An electrode 13 for contacting the surface of the substrate 11 to be plated and a seal 17 (not shown) for contacting the surface to be plated in such a manner as to protect the electrode 13 from the plating solution 10 have been mounted on the substrate holding mechanism 12.

At this time, bubbles 15 each having a size of about several tens of micrometers stagnate under the surface of the rotating substrate 11 to be plated, as shown in FIGS. 10A and 10B, while the bubbles 15 are expelled from the surface of the substrate 11 to be plated to the outside of the substrate holding mechanism 12 by the rotation of the substrate 11 and the ascending current 10a of the plating solution 10. The expelling of the bubbles 15 is completed within 1 second. Whether or not the expelling of the bubbles 15 has been completed is checked by examining a variation in resistance value with an extremely small current applied when the semiconductor substrate 11 is immersed in the plating solution 10.

When the semiconductor substrate is brought into contact with the plating solution, extremely small bubbles each having a size of about several micrometers or less are adsorbed to the surface to be plated such as, e.g., the surface of a Cu seed film. In the conventional plating method and plating apparatus, however, the extremely small bubbles cannot be removed. Consequently, the problem occurs during the subsequent plating growth that the plating growth is hindered at the portions of the surface to be plated to which the bubbles are adsorbed.

FIGS. 11A and 11B, FIGS. 12A and 12B, and FIGS. 13A to 13C are views for illustrating the problem encountered in the conventional method for plating a substrate.

Specifically, as shown in FIG. 11A, an interlayer insulating film 22, a TaN barrier film 23, and a Cu seed film 24 are deposited successively on the substrate 21. When the substrate 21 is then immersed in a plating solution 26 with the surface of the Cu seed film 24 to be plated facing downward, the bubbles 25 are adsorbed to the surface of the Cu seed film 24. If a plating process is performed in this state, a plate film 27 is formed with the bubbles 25 adsorbed to the surface of the Cu seed film 24 so that a pit defect (pit-type defect) 28 and voids 29 are formed finally in the plate film 27, as shown in FIG. 11B.

If particles 30 are adhered onto the Cu seed film 24 at the time at which the interlayer insulating film 22, the TaN barrier film 23, and the Cu seed film 24 are deposited on the substrate 21 as shown in FIG. 12A, the following problem arises. That is, when the substrate 21 is brought into contact with the plating solution 26, the bubbles 25 are adsorbed to the surface of the Cu seed film 24 with the particles 30 serving as nuclei so that the pit defect 28 and the voids 29 are formed in the plate film 27 in the same manner as in the foregoing case, as shown in FIG. 12B.

If these defects, specifically the pit defect 28, the voids 29, and the like occur in, e.g., a wiring portion composed of the plate film 27 buried in the insulating film 22, a contact portion composed of the plate film 27 filled in a hole reaching a lower-layer wire, or the like, reliability degradation such as deteriorated resistance to electromigration occurs.

There are other cases where problems as shown in FIGS. 13A to 13C are encountered in the conventional method for plating a substrate.

As shown in FIG. 13A, a first interlayer insulating film 52 is formed on a substrate 51, while a lower-layer wire composed of a TaN barrier film 53 and a Cu plate film 54 is buried in the first interlayer insulating film 52. Here, a depression resulting from the foregoing pit defect or the like is formed in the Cu plate film 54. If a SiN film 55 and a second interlayer insulating film 56 are formed on the first interlayer insulating film 52 including the lower-layer wire, therefore, a depression 57 resulting from the foregoing depression may also be formed in the surface of the second interlayer insulating film 56.

If such a depression 57 occurs in a region formed with a wide wire (upper-layer wire), a serious fault is less likely to occur in the portion formed with the depression 57. If the depression 57 is transferred onto the region of the second interlayer insulating film 56 other than the upper-layer wire formation region, however, a faulty pattern may be formed during lithography for forming a trench for an upper-layer wire due to the concave configuration of the depression 57. Otherwise, the following problem occurs when an upper-layer wire 58 composed of a TaN barrier film 58a and a Cu plate film 58b is buried in the second interlayer insulating film 56, as shown in FIG. 13B. That is, the residues of the TaN film 59a and the Cu film 59b resulting from the polishing of a wiring material are filled also in the depression 57 to form a conductive portion 59, which causes an inter-wire short circuit in the upper-layer wire 58, as shown in FIG. 13C. FIG. 13C is a plan view corresponding to FIG. 13B. In other words, FIG. 13B is a cross-sectional view taken along the line B–B' of FIG. 13C.

SUMMARY OF THE INVENTION

In view of the foregoing, it is therefore an object of the present invention to prevent the occurrence of a defect in a plate film resulting from the adsorption of bubbles to the surface to be plated.

To attain the object, a first method for plating a substrate according to the present invention assumes a method for plating a substrate through a plating process performed with respect to the substrate by facing a surface of the substrate to be plated downward and immersing the substrate in a plating solution, the method comprising the steps of: rotating the substrate in the plating solution at a first speed of rotation and thereby removing a bubble adsorbed to the substrate; and after the step of removing the bubble, rotating the substrate in the plating solution at a second speed of rotation lower than the first speed of rotation and thereby performing the plating process with respect to the substrate.

In accordance with the first method for plating a substrate, the substrate is rotated in the plating solution at a higher speed before the plating process is initiated so that the majority of the bubbles adsorbed to the substrate are removed. This circumvents the formation of a pit-type defect or a void in a plate film resulting from the adsorption of the bubbles and thereby allows the fabrication of a high-reliability electronic device which is less likely to suffer an inter-wire short circuit if the plate film is, e.g., a conductive film for wiring.

A second method for plating a substrate according to the present invention assumes a method for plating a substrate through a plating process performed with respect to the substrate by facing a surface of the substrate to be plated downward and immersing the substrate in a plating solution, the method comprising the step of: improving a wettability of the surface to be plated before immersing the substrate in the plating solution.

In accordance with the second method for plating a substrate, the wettability of the surface of the substrate to be plated is improved before the substrate is immersed in the plating solution so that the number of bubbles adsorbed to the substrate when the substrate is immersed in the plating solution is reduced significantly. This circumvents the formation of a pit-type defect or a void in a plate film resulting from the adsorption of the bubbles and thereby allows the fabrication of a high-reliability electronic device which is less likely to suffer an inter-wire short circuit if the plate film is, e.g., a conductive film for wiring.

Since the present invention thus rotates the substrate in the plating solution at a higher speed before initiating the plating process or improves the wettability of the surface of the substrate to be plated before immersing the substrate in the plating solution, the plating process can be performed with respect to the substrate with no bubble adsorbed to the substrate. This circumvents the formation of a pit-type defect or a void in the plate film and thereby allows the fabrication of a high-reliability electronic device which less likely to suffer an interlayer short circuit if the plate film is, e.g., a conductive film for wiring.

BRIEF DESCRIPTION OF THE DRAWINGS

FIGS. 1A to 1E are cross-sectional views illustrating the individual process steps of a method for plating a substrate according to a first embodiment of the present invention;

FIGS. 4A to 4E are cross-sectional views illustrating the individual process steps of a method for plating a substrate according to a second embodiment of the present invention;

FIGS. 5A to 5E are cross-sectional views illustrating the individual process steps of a method for plating a substrate according to a third embodiment of the present invention;

FIGS. 6A to 6E are cross-sectional views illustrating the individual process steps of a method for plating a substrate according to a fourth embodiment of the present invention;

DETAILED DESCRIPTION OF THE INVENTION

Figure 1A:
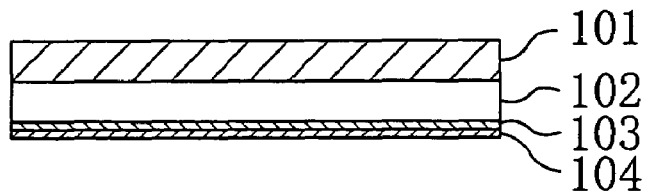

Referring now to the drawings, the individual embodiments of the present invention will be described herein below by using, as an example, the case where a plate film for wiring made of Cu, which is a wiring material capable of achieving the maximum effect of the present invention, is formed.

Each of methods for plating substrates according to the first to fourth embodiments is characterized in that bubbles 105 formed at the surface of a Cu seed film 104 to be plated when the substrate 101 is brought into contact with a plating solution 106 are removed (see FIG. 1 and FIGS. 4 to 6). In accordance with each of the methods according to the individual embodiments, the plating solution 106 caused to flow along the surface to be plated by the rotation of the substrate 101 washes away the bubbles 105 removed from the surface to be plated to the peripheral portion of the substrate 101. In an apparatus for plating a substrate used in each of the methods according to the individual embodiments, therefore, the contact angle of the seal 210b of a substrate holding mechanism 210 relative to the surface of the substrate 209 to be plated is adjusted to an angle over 90° (more preferably, to an angle not less than 120° and not more than 150°), as will be described later in detail. The arrangement prevents the bubbles from stagnating at the portion of the seal 210b in contact with the substrate 209 (see FIG. 8).

EMBODIMENT 1

A method for plating a substrate according to the first embodiment of the present invention will be described with reference to the drawings.

FIGS. 1A to 1E are cross-sectional views illustrating the individual process steps of the method for plating a substrate according to the first embodiment. In FIGS. 1A to 1E, the substrate is shown with the principal surface thereof to be formed with wiring and the like facing downward.

First, as shown in FIG. 1A, an interlayer insulating film 102, a TaN barrier film 103, and the Cu seed film 104 are deposited successively on the substrate 101.

Figure 1B:
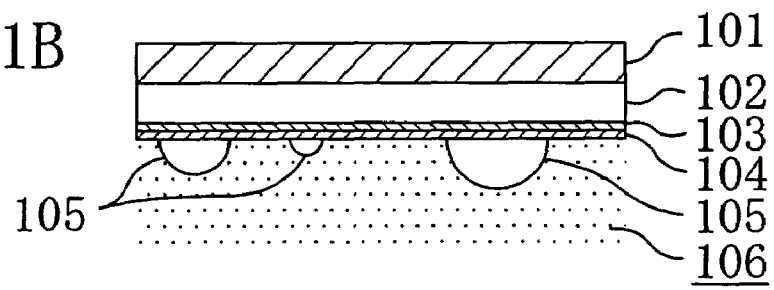

Subsequently, as shown in FIG. 1B, the substrate 101 is placed in a substrate holding mechanism (not shown) to be held thereby and brought into contact with the plating solution 106 in the face down state by using the mechanism. At this time, bubbles 105 are adsorbed to the surface of the Cu seed film 104 to be plated. The bubbles 105 are extremely small bubbles each having a size of about several to several tens of micrometers or less and formed under the influence of oxidation or organic contamination on the surface of the Cu seed film 104 or resulting from particles or the like adhered to the Cu seed film 104. In short, the bubbles 105 are not bubbles resulting from stirring or the like in a plating bath and each having a size of about several tens of micrometers or more. In FIG. 1B, the bubbles 105 are depicted under magnification for easy understanding of the description.

Thereafter, the substrate 101 held by the substrate holding mechanism is rotated at a high speed, while leaving the surface of the Cu seed film 104 immersed in the plating solution 106, whereby the bubbles 105 are eliminated from the surface of the Cu seed film 104. If the bubbles 105 are not removed, i.e., if plating growth is continued with the bubbles 105 adsorbed to the substrate 101, plating growth does not occur at the portions of the Cu seed film 104 to which the bubbles 105 are adhered so that pit-type defects, voids, or the like are formed disadvantageously (see FIGS. 11A and 11B or FIGS. 12A and 12B).

To prevent the occurrence of these defects, the present embodiment specifically rotates the substrate 101 for, e.g., about 1 to 20 seconds at a revolution speed (speed of rotation), e.g., not less than 100 rpm and not more than 500 rpm (more preferably, not less than 100 rpm and not more than 200 rpm). Since the normal revolution speed of the substrate in the subsequent step of plating growth is 10 to 100 rpm (more preferably, not less than 10 rpm and not more than 60 rpm), the revolution speed of the substrate in the step shown in FIG. 1C (high-speed-rotation wafer debubbling step) is considerably higher than the normal revolution speed of the substrate. In the present embodiment, the high-speed-rotation wafer debubbling step ensures the removal of the bubbles 105 from the substrate 101.

Figure 1D:
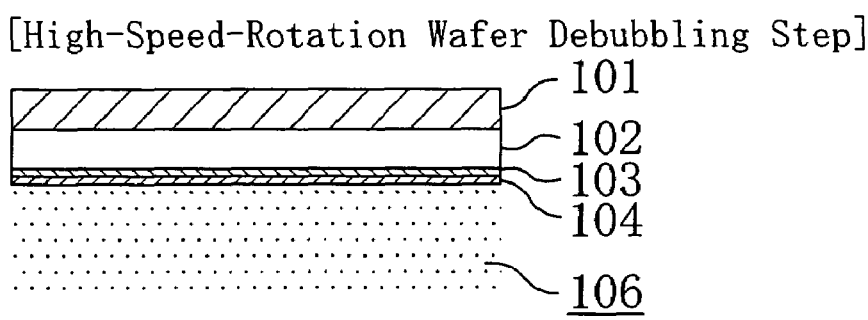
Figure 1D:
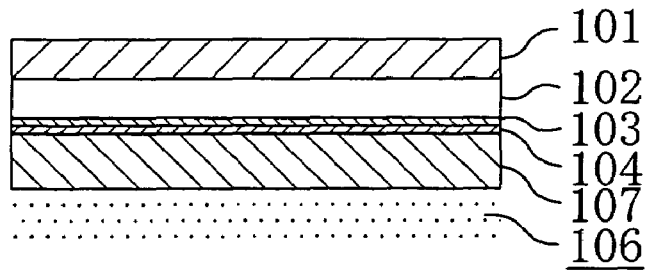
Figure 1E:
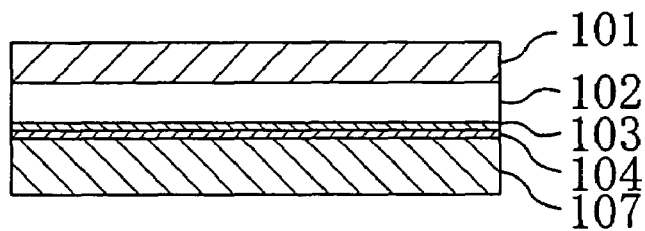

Subsequently, as shown in FIG. 1D, the revolution speed of the substrate 101 held by the substrate holding mechanism is reduced to, e.g., about 10 to 60 rpm, while leaving the surface of the Cu seed film 104 immersed in the plating solution 106. Since the bubbles 105 no more exist at the surface of the Cu seed film 104, a plating process can be performed with respect to the substrate 101 without causing a pit defect or the like. In other words, a high-reliability Cu plate film 107 can be grown gradually on the Cu seed film 104. FIG. 1E shows the state in which plating growth for the Cu plate film 107 has been performed completely.

Since the first embodiment thus rotates the substrate 101 in the plating solution 106 at a high speed before initiating the plating process, the majority of the bubbles 105 adsorbed to the substrate 101 can be removed. This circumvents the formation of pit-type defects or voids in the Cu plate film 107 resulting from the adsorption of the bubbles 105 and thereby allows the fabrication of a high-reliability electronic device less likely to suffer an inter-wire short circuit.

Figure 2A:
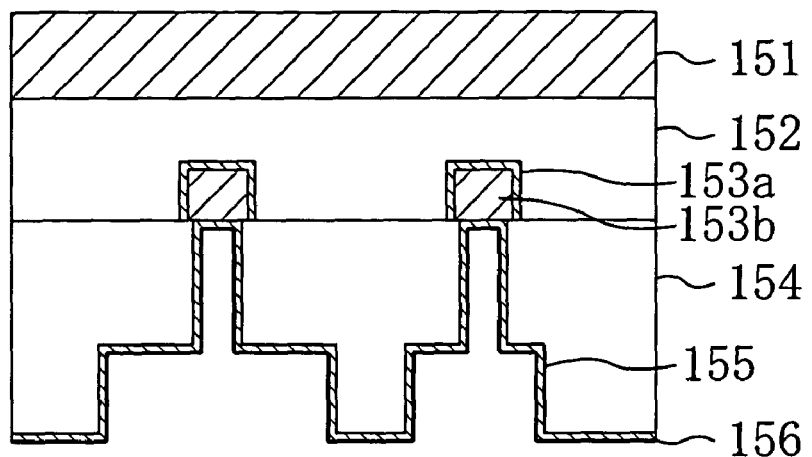
FIGS. 2A to 2C are cross-sectional views illustrating the individual process steps of a method for forming a Cu wire having a dual damascene structure by using the method for plating a substrate according to the first embodiment.
Figure 2B:
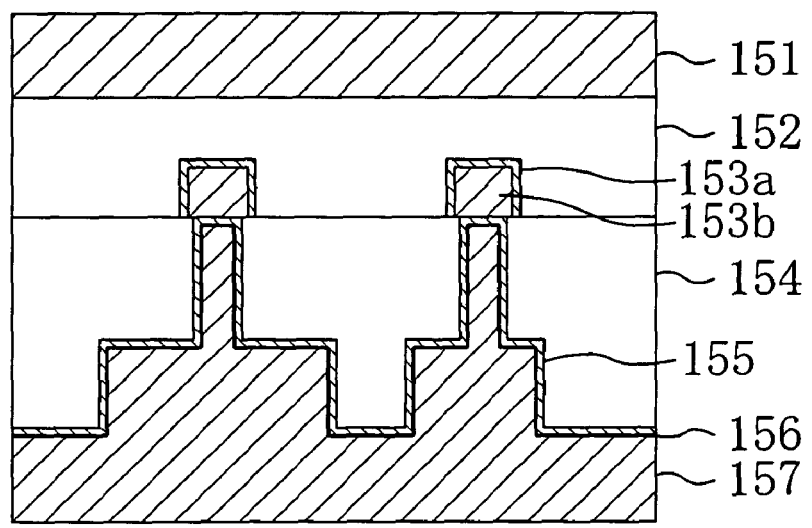
Figure 2C:
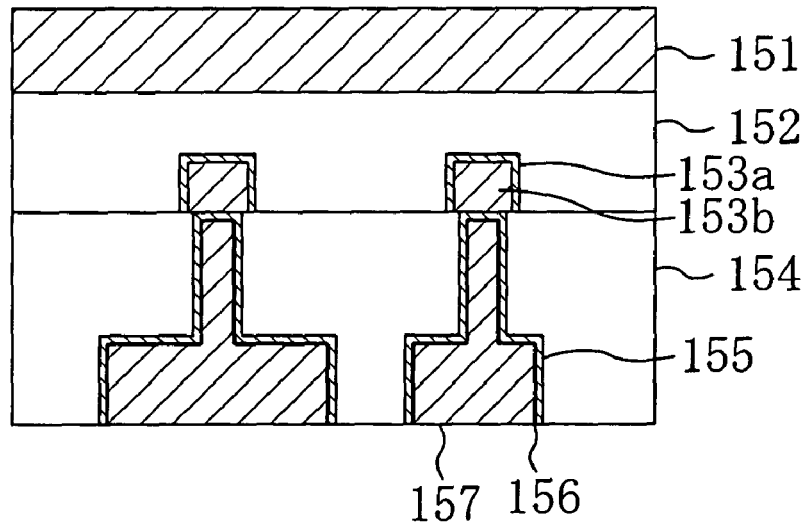

Referring to FIGS. 2A to 2C, a method for forming a Cu wire having a dual damascene structure based on the method according to the present embodiment will be described. In FIGS. 2A to 2C, the substrate is shown with the principal surface thereof to be formed with wiring and the like facing downward.

First, as shown in FIG. 2A, a first interlayer insulating film 152 is formed on a substrate 151, while a lower-layer wire 153 (not shown) composed of a TaN barrier film 153a and a Cu film 153b is buried in the first interlayer insulating film 152. Subsequently, a second interlayer insulating film 154 is formed on each of the lower-layer wire 153 and the first interlayer insulating film 152. Then, a depressed portion composed of a hole reaching the lower-layer wire 153 and a trench for an upper-layer wire is formed in the second interlayer insulating film 154. Thereafter, a TaN barrier film 155 and a Cu seed film 156 are deposited successively on the second interlayer insulating film 154 including the depressed portion in such a manner as to fill the depressed portion midway.

Next, as shown in FIG. 2B, the substrate 151 is immersed in the plating solution (not shown) in the face down state. Then, the high-speed-rotation wafer debubbling step according to the present embodiment is performed with respect to the substrate 151. Thereafter, a plating process is performed with respect to the substrate 151, while reducing the revolution speed of the substrate 151. Consequently, a high-reliability Cu plate film 157 can be formed on the Cu seed film 156 such that the depressed portion is filled completely.

Next, as shown in FIG. 2C, the respective portions of the Cu plate film 157, the Cu seed film 156, and the TaN barrier film 155 located outside the depressed portion are removed, whereby an upper-layer wire connected electrically to the lower-layer wire 153 is formed.

Figure 3:
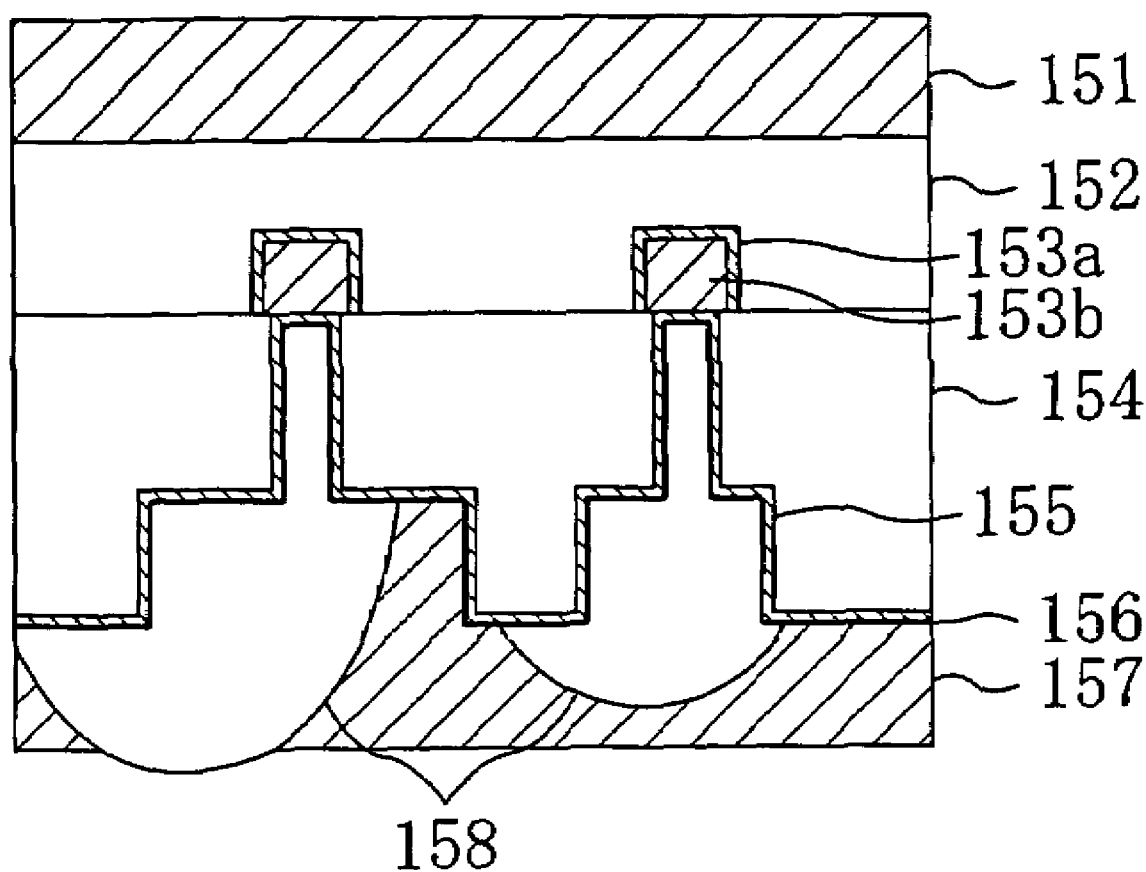
FIG. 3 is a view showing the case where the step of removing bubbles of the method for plating a substrate according to the first embodiment has not been performed in the step shown in FIG. 2B.

FIG. 3 shows, as a comparative example, the case where the high-speed-rotation wafer debubbling step according to the present embodiment has not been performed in the step shown in FIG. 2B.

If the high-speed-rotation wafer debubbling step is not performed, bubbles 158 are adsorbed to the surface of the Cu seed film 156 when the substrate 151 is immersed in the plating solution in the face down state and plating growth for the Cu plate film 157 is performed with the bubbles adsorbed to the surface of the Cu seed film 156, as shown in FIG. 3. As a result, plating growth for the Cu plate film 157 is completed with, e.g., the depressed portion being covered with the bubbles 158 so that a serious problem occurs in the resulting dual damascene structure.

In the first embodiment, although the substrate 101 is brought into contact with the plating solution 106 and then the substrate 101 is rotated for the removal of the bubbles 105 therefrom, it is also possible to bring the substrate 101 into contact with the plating solution 106, while rotating the substrate 101 at a higher speed than at the number or revolutions in the plating process step shown in FIG. 1D, e.g., at a revolution speed equal to that in the bubble removing step (high-speed-rotation wafer debubbling step).

When the bubble removing step is performed in the first embodiment, the plating solution 106 is preferably convected (circulated). The arrangement allows more positive washing away of the bubbles 105 from the surface of the substrate 101.

When the bubble removing step is performed in the first embodiment, supersonic vibration is applied preferably to the plating solution 106. The arrangement allows more positive washing away of the bubbles 105 from the surface of the substrate 101.

Although a voltage (plating current) need not be applied to the Cu seed film 104 in the bubble removing step in the first embodiment, the bubble removing step may also be performed, while applying a weak voltage to the substrate 101, to prevent the thin Cu seed film 104 (especially the portion thereof formed with the depressed portion) from being dissolved in the plating solution 106 during the bubble removing step. In this case, the voltage applied to the substrate 101 preferably has a magnitude such that the density of the plating current in the substrate 101 is in the range of 0.1 to 5.0 mA/cm$^2$. The normal density of the plating current in the substrate during the plating process is about 10 mA/cm$^2$ or more.

The first embodiment has also brought the substrate 101 into contact with the plating solution 106 and subsequently performed the bubble removing step based on high-speed substrate rotation. If the high-speed substrate rotation presents a problem to the filling of the plate film in an extremely small opening (e.g., at least that one of the depressed portions present in the surface to be plated which has a minimum diameter), it is also possible to bring the substrate 101 into contact with the plating solution 106, fill the plate film in the extremely small opening, and then perform the bubble removing step. The arrangement permits each of the filling of the plate film into the extremely small opening such as an extremely small hole and the removal of the bubbles to be performed. At this time, the thickness of the plate film required to fill up the extremely small opening is 0.08 μm or less if the diameter of the extremely small opening is, e.g., 0.16 μm. The thickness of the plate film required to fill up the extremely small opening is preferably 20% or less of the final thickness (target thickness) of the plate film at the time at which plating growth is completed. Preferably, the revolution speed of the substrate in filling up the extremely small opening is lower than the revolution speed of the substrate in the bubble removing step (high-speed-rotation wafer debubbling step), e.g., at a revolution speed equal to that in the plating process step shown in FIG. 1D.

Although the first embodiment has described the case where the plate film for wiring made of Cu is formed, it will easily be appreciated that the present embodiment is also applicable to the case where a plate film made of another material is formed for a different application.

EMBODIMENT 2

A method for plating a substrate according to the second embodiment of the present invention will be described with reference to the drawings.

FIGS. 4A to 4E are cross-sectional views illustrating the individual process steps of the method for plating a substrate according to the second embodiment. In FIGS. 4A to 4E, the substrate is shown with the principal surface thereof to be formed with wiring and the like facing downward.

Figure 4A:
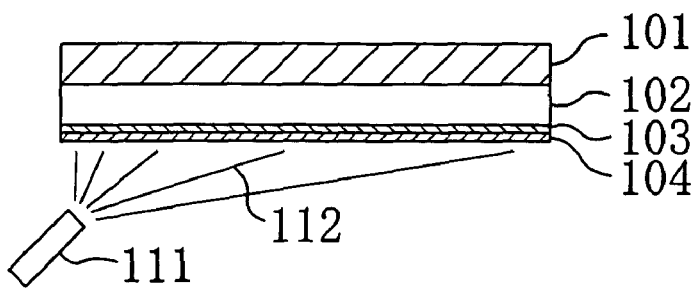

First, as shown in FIG. 4A, an interlayer insulating film 102, a TaN barrier film 103, and a Cu seed film 104 are deposited successively on a substrate 101.

Then, the present embodiment ejects a pure water shower 112 from a pure water ejection nozzle 111 onto the surface of the Cu seed film 104 to be plated, while holding the substrate 101 in the face down state by using a substrate holding mechanism (not shown).

If a process is not particularly performed after the deposition of the Cu seed film 104 as in a normal plating process, the surface of the Cu seed film 104 is oxidized or affected by organic contamination from a substrate cassette or from an ambient atmosphere so that the wettability of the surface of the Cu seed film 104 to a plating solution 106 (see FIG. 4C) deteriorates. By contrast, the present embodiment preliminarily wets the surface of the Cu seed layer 104 with pure water 113 (see FIG. 4B) before immersing the substrate 101 in the plating solution 106, thereby improving the wettability of the surface of the Cu seed film 104.

Figure 4B:
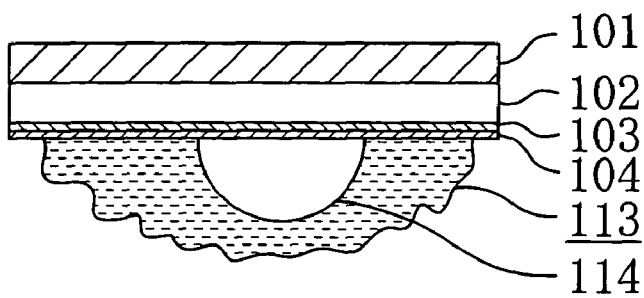

Specifically, the pure water 113 is sprayed onto the surface of the Cu seed film 104 to bring the surface of the Cu seed film 104 into a wet state, as shown in FIG. 4B. Consequently, the number of bubbles 105 (see FIG. 4C) adsorbed to the surface of the Cu seed film 104 when the substrate 101 is immersed in the plating solution 106 is reduced.

In the case of spraying the pure water 113 (not shown) onto the surface of the Cu seed film 104, however, relatively large bubbles 114 are formed disadvantageously in the pure water 113 adsorbed to the surface of the Cu seed film 104. In the present embodiment, therefore, there are cases where the bubbles 114 each having a size exceeding about several micrometers remain on the surface of the Cu seed film 104 at the time at which the substrate 101 is immersed in the plating solution 106, though the total number of bubbles adsorbed to the surface of the Cu seed film 104 is reduced at that time.

Figure 4C:
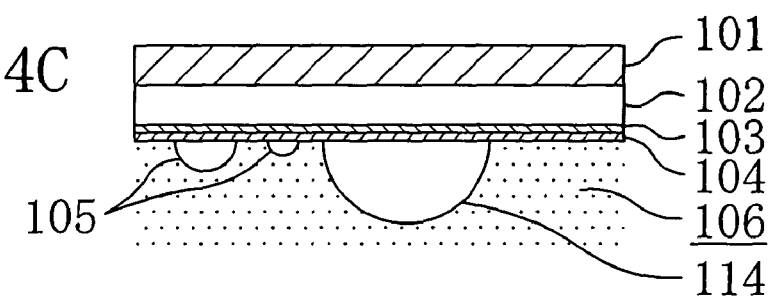
Figure 4C:
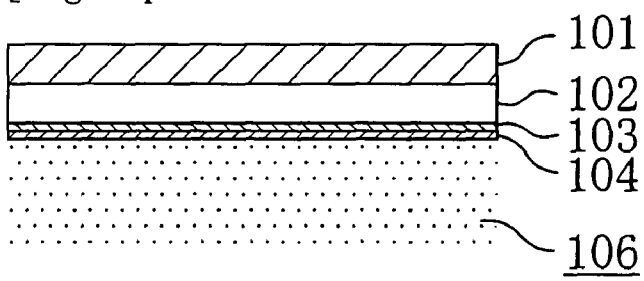

To prevent this, the substrate 101 is brought into contact with the plating solution 106 in the face down state by using the substrate holding mechanism, as shown in FIG. 4C, and then the substrate 101 held by the mechanism is rotated at a high speed, as shown in FIG. 4D. As a result, the extremely small bubbles 105 formed when the substrate 101 is brought into contact with the plating solution 106 can be eliminated from the surface of the Cu seed film 104 under a centrifugal force produced by the rotation of the substrate 101, while the larger bubbles 114 formed upon the spraying of the pure water 113 onto the surface of the Cu seed film 104 can also be removed. In FIGS. 4B and 4C, the bubbles 105 and 114 are depicted under magnification for easy understanding of the description.

In the step shown in FIG. 4D (high-speed-rotation wafer debubbling step), the substrate 101 is rotated for, e.g., about 1 to 20 seconds at a revolution speed (speed of rotation), e.g., not less than 100 rpm and not more than 500 rpm (more preferably, not less than 100 rpm and not more than 200 rpm). Since the normal revolution speed of the substrate in the subsequent plating process step is 10 to 100 rpm (more preferably, not less than 10 rpm and not more than 60 rpm), the revolution speed of the substrate in the high-speed-rotation wafer debubbling step is considerably higher than the normal revolution speed of the substrate.

Figure 4E:
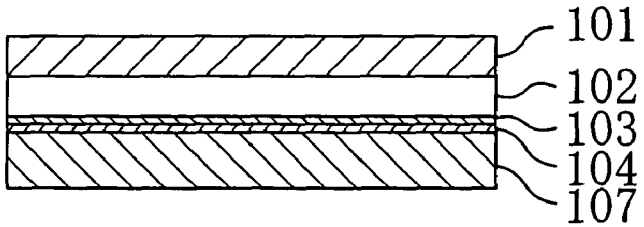

Subsequently, the revolution speed of the substrate 101 held by the substrate holding mechanism is reduced to, e.g., about 10 to 60 rpm, while leaving the surface of the Cu seed film 104 immersed in the plating solution 106, whereby the step of plating growth (plating process) is performed. The plating process to the substrate 101 can be performed without causing pit defects or the like since the bubbles 105 and 114 have been eliminated from the surface of the Cu seed film 104 by the high-speed-rotation wafer debubbling step. In other words, a high-reliability Cu plate film 107 can be grown gradually on the Cu seed film 104. FIG. 4E shows the state in which plating growth for the Cu plate film 107 has been performed completely.

Thus, according to the second embodiment, the wettability of the surface of the Cu seed film 104 as the surface of the substrate 101 to be plated is improved before the substrate 101 is immersed in the plating solution 106 so that the number of the bubbles 105 adsorbed to the substrate 101 when the substrate 101 is immersed in the plating solution 106 is reduced significantly. Moreover, the substrate 101 is rotated in the plating solution 106 at a higher speed before the plating process is initiated so that the majority of the bubbles 105 and 114 adsorbed to the substrate 101 are removed. This circumvents the formation of tip-type defects or voids in the Cu plate film 107 resulting from the adsorption of the bubbles 105 and 114 and thereby allows the fabrication of a high-reliability electronic device less likely to suffer an inter-wire short circuit.

In the second embodiment, although the substrate 101 is brought into contact with the plating solution 106 and then the substrate 101 is rotated for the removal of the bubbles 105 and 114 therefrom, it is also possible to bring the substrate 101 into contact with the plating solution 106, while rotating the substrate 101 at a higher speed than at the number or revolutions in the plating process step, e.g., at a revolution speed equal to that in the bubble removing step (high-speed-rotation wafer debubbling step).

When the bubble removing step is performed in the second embodiment, the plating solution 106 is preferably convected (circulated). The arrangement allows more positive washing away of the bubbles 105 and 114 from the surface of the substrate 101.

When the bubble removing step is performed in the second embodiment, supersonic vibration is applied preferably to the plating solution 106. The arrangement allows more positive washing away of the bubbles 105 and 114 from the surface of the substrate 101.

Although a voltage (plating current) need not be applied to the Cu seed film 104 in the bubble removing step in the second embodiment, the bubble removing step may also be performed, while applying a weak voltage to the substrate 101, to prevent the thin Cu seed film 104 (especially the portion thereof formed with the depressed portion) from being dissolved in the plating solution 106 during the bubble removing step. In this case, the voltage applied to the substrate 101 preferably has a magnitude such that the density of the plating current in the substrate 101 is in the range of 0.1 to 5.0 $mA/cm^2$. The normal density of the plating current in the substrate during the plating process is about 10 $mA/cm^2$ or more.

Although the second embodiment has supplied the pure water 113 onto the surface of the substrate 101 to be plated (the surface of the Cu seed film 104) by using the pure water ejection nozzle 111 before immersing the substrate 101 in the plating solution 106 to improve the wettability of the surface to be plated, it is also possible to supply another liquid to the surface to be plated by using another supplying mechanism instead.

The second embodiment has also brought the substrate 101 into contact with the plating solution 106 and subsequently performed the bubble removing step based on high-speed substrate rotation. If the high-speed substrate rotation presents a problem to the filling of the plate film in an extremely small opening (e.g., at least that one of the depressed portions present in the surface to be plated which has a minimum diameter), it is also possible to bring the substrate 101 into contact with the plating solution 106, fill the plate film in the extremely small opening, and then perform the bubble removing step. The arrangement permits each of the filling of the plate film into the extremely small opening such as an extremely small hole and the removal of the bubbles to be performed. At this time, the thickness of the plate film required to fill up the extremely small opening is 0.08 μm or less if the diameter of the extremely small opening is, e.g., 0.16 μm. The thickness of the plate film required to fill up the extremely small opening is preferably 20% or less of the final thickness (target thickness) of the plate film at the time at which plating growth is completed.

Preferably, the revolution speed of the substrate in filling up the extremely small opening is lower than the revolution speed of the substrate in the bubble removing step (high-speed-rotation wafer debubbling step), e.g., at a revolution speed equal to that in the plating process step.

In the second embodiment, the bubble removing step shown in FIG. 4D may be omitted.

Although the second embodiment has described the case where the plate film for wiring made of Cu is formed, it will easily be appreciated that the present embodiment is also applicable to the case where a plate film made of another material is formed for a different application.

EMBODIMENT 3

A method for plating a substrate according to the third embodiment of the present invention will be described with reference to the drawings.

FIGS. 5A to 5E are cross-sectional views illustrating the individual process steps of the method for plating a substrate according to the third embodiment. In FIGS. 5A to 5E, the substrate is shown with the principal surface thereof to be formed with wiring and the like facing downward.

First, as shown in FIG. 5A, an interlayer insulating film 102, a TaN barrier film 103, and the Cu seed film 104 are deposited successively on the substrate 101. At this time, particles 115 of Cu or the like formed during the deposition of the Cu seed film 104 are adsorbed to the surface of the Cu seed film 104. If the substrate 101 is immersed in the plating solution with the particles 115 present on the surface of the Cu seed film 104, bubbles are formed with the particles 115 serving as nuclei, thereby forming defects in a plate film.

To prevent this, the present embodiment is characterized by ejecting, after the deposition of the Cu seed film 104, a supersonic-vibration-applied pure water shower 117 from a supersonic-vibration-applied pure water ejection nozzle 116 onto the surface of the Cu seed film 104 to be plated, while holding the substrate 101 in the face down state by using a substrate holding mechanism (not shown). The supersonic-vibration-applied pure water shower 117 is ejected onto the entire surface of the substrate 101, whereby the particles adhered to the surface of the Cu seed film 104 are removed as shown in FIG. 5B. This suppresses the formation of bubbles using the particles 115 as nuclei when the substrate 101 is immersed in the plating solution and thereby circumvents the situation in which pit defects, voids, and the like are formed in the plate film.

In the step shown in FIG. 5A, the wettability of the surface of the Cu seed film 104 relative to the plating solution is also improved by spraying pure water onto the surface of the Cu seed film 104 at the same time as supersonic vibration is applied to the surface of the Cu seed film 104 to be plated to remove the particles 115 therefrom. As a result, the number of extremely small bubbles adsorbed to the surface of the Cu seed film 104 when the substrate 101 is immersed in the plating solution is further reduced. However, there are cases where relatively large bubbles are adsorbed to the surface of the Cu seed film 104 when the surface thereof is cleaned with the foregoing pure water applied with supersonic vibration.

To prevent this, the surface of the Cu seed film 104 on the substrate 101 held in the face down state by the substrate holding mechanism is brought into contact with the plating solution 106, as shown in FIG. 5C. Then, as shown in FIG. 5D, the substrate 101 held by the mechanism is rotated at a high speed. As a result, the extremely small bubbles 105 formed when the substrate 101 is brought into contact with the plating solution 106 can be eliminated from the surface of the Cu seed film 104 under a centrifugal force produced by the rotation of the substrate 101, while the larger bubbles formed upon the spraying of the pure water applied with supersonic vibration onto the surface of the Cu seed film 104 can also removed. In FIG. 5C, the bubbles 105 are depicted under magnification for easy understanding of the description.

In the step shown in FIG. 5D (high-speed-rotation wafer debubbling step), the substrate 101 is rotated for, about 1 to 20 seconds at a revolution speed (speed of rotation), e.g., not less than 100 rpm and not more than 500 rpm (more preferably, not less than 100 rpm and not more than 200 rpm). Since the normal revolution speed of the substrate in the subsequent plating process step is 10 to 100 rpm (more preferably, not less than 10 rpm and not more than 60 rpm), the revolution speed of the substrate in the high-speed-rotation wafer debubbling step is considerably higher than the normal revolution speed of the substrate.

Subsequently, the revolution speed of the substrate 101 held by the substrate holding mechanism is reduced to, e.g., about 10 to 60 rpm, while leaving the surface of the Cu seed film 104 immersed in the plating solution 106, whereby the step of plating growth (plating process) is performed in accordance with a normal plating method which applies an electric field to the plating solution 106. The plating process to the substrate 101 can be performed without causing pit defects or voids since the bubbles 105 have been eliminated from the surface of the Cu seed film 104 by the high-speed-rotation wafer debubbling step. In other words, a high-reliability Cu plate film 107 can be grown gradually on the Cu seed film 104. FIG. 5E shows the state in which plating growth for the Cu plate film 107 has been performed completely.

Thus, according to the third embodiment, the particles 115 adhered to the surface of the Cu seed film 104 as the surface of the substrate 101 to be plated are removed and the wettability of the surface of the Cu seed film 104 is improved before the substrate 101 is immersed in the plating solution 106 so that the number of the bubbles adsorbed to the substrate 101 when the substrate 101 is immersed in the plating solution 106 is reduced significantly. Moreover, the substrate 101 is rotated in the plating solution 106 at a higher speed before the plating process is initiated so that the majority of the bubbles adsorbed to the substrate 101 are removed. This circumvents the formation of tip-type defects or voids in the Cu plate film 107 resulting from the adsorption of the bubbles and thereby allows the fabrication of a high-reliability electronic device less likely to suffer an inter-wire short circuit.

In the third embodiment, although the substrate 101 is brought into contact with the plating solution 106 and then the substrate 101 is rotated for the removal of the bubbles therefrom, it is also possible to bring the substrate 101 into contact with the plating solution 106, while rotating the substrate 101 at a higher speed than at the number or revolutions in the plating process step, e.g., at a revolution speed equal to that in the bubble removing step (high-speed-rotation wafer debubbling step).

When the bubble removing step is performed in the third embodiment, the plating solution 106 is preferably con-vected (circulated). The arrangement allows more positive washing away of the bubbles from the surface of the substrate 101.

When the bubble removing step is performed in the third embodiment, supersonic vibration is applied preferably to the plating solution 106. The arrangement allows more positive washing away of the bubbles from the surface of the substrate 101.

Although a voltage (plating current) need not be applied to the Cu seed film 104 in the bubble removing step in the third embodiment, the bubble removing step may also be performed, while applying a weak voltage to the substrate 101, to prevent the thin Cu seed film 104 (especially the portion thereof formed with the depressed portion) from being dissolved in the plating solution 106 during the bubble removing step. In this case, the voltage applied to the substrate 101 preferably has a magnitude such that the density of the plating current in the substrate 101 is in the range of 0.1 to 5.0 mA/cm$^2$. The normal density of the plating current in the substrate during the plating process is about 10 mA/cm$^2$ or more.

Although the third embodiment has applied supersonic vibration to the surface of the Cu seed film 104 to be plated to remove the particles 115 adhered thereto before immersing the substrate 101 in the plating solution 106, a method for removing the particles 115 is not particularly limited in the present embodiment. Although the third embodiment has supplied pure water to the surface to be plated to improve the wettability thereof, it is also possible to supply another liquid instead of the pure water. At that time, supersonic vibration may also be applied to the other liquid.

The third embodiment has also brought the substrate 101 into contact with the plating solution 106 and subsequently performed the bubble removing step based on high-speed substrate rotation. If the high-speed substrate rotation presents a problem to the filling of the plate film in an extremely small opening (e.g., at least that one of the depressed portions present in the surface to be plated which has a minimum diameter), it is also possible to bring the substrate 101 into contact with the plating solution 106, fill the plate film in the extremely small opening, and then perform the bubble removing step. The arrangement permits each of the filling of the plate film into the extremely small opening such as an extremely small hole and the removal of the bubbles to be performed. At this time, the thickness of the plate film required to fill up the extremely small opening is 0.08 μm or less if the diameter of the extremely small opening is, e.g., 0.16 μm. The thickness of the plate film required to fill up the extremely small opening is preferably 20% or less of the final thickness (target thickness) of the plate film at the time at which plating growth is completed. Preferably, the revolution speed of the substrate in filling up the extremely small opening is lower than the revolution speed of the substrate in the bubble removing step (high-speed-rotation wafer debubbling step), e.g., at a revolution speed equal to that in the plating process step.

In the third embodiment, the bubble removing step shown in FIG. 5D may be omitted.

Although the third embodiment has described the case where the plate film for wiring made of Cu is formed, it will easily be appreciated that the present embodiment is also applicable to the case where a plate film made of another material is formed for a different application.

EMBODIMENT 4

A method for plating a substrate according to the fourth embodiment of the present invention will be described with reference to the drawings.

FIGS. 6A to 6E are cross-sectional views illustrating the individual process steps of the method for plating a substrate according to the fourth embodiment. In FIGS. 6A to 6E, the substrate is shown with the principal surface thereof to be formed with wiring and the like facing downward.

Figure 6A:
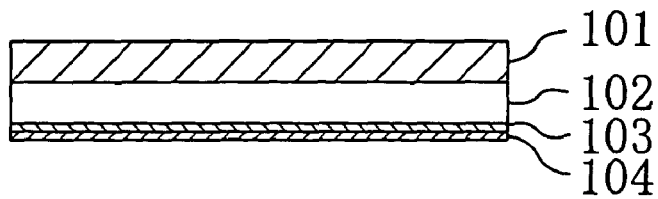

First, as shown in FIG. 6A, an interlayer insulating film 102, a TaN barrier film 103, and the Cu seed film 104 are deposited successively on the substrate 101.

Figure 6B:
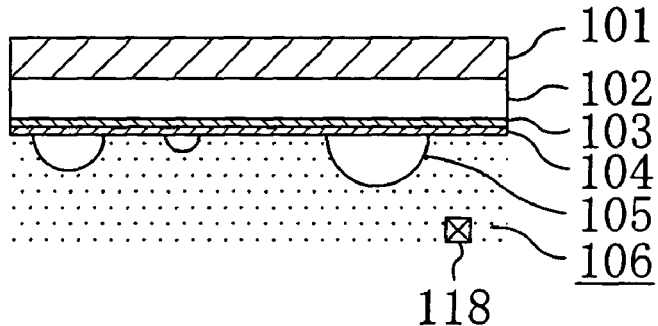

Subsequently, as shown in FIG. 6B, the substrate 101 is placed in a substrate holding mechanism (not shown) to be held thereby and brought into contact with the plating solution 106 in the face down state by using the mechanism. At this time, bubbles 105 are adsorbed to the surface of the Cu seed film 104 to be plated. The plating solution 106 has been reserved in a plating bath (not shown) having a supersonic vibration generator 118 attached thereto.

Figure 6C:
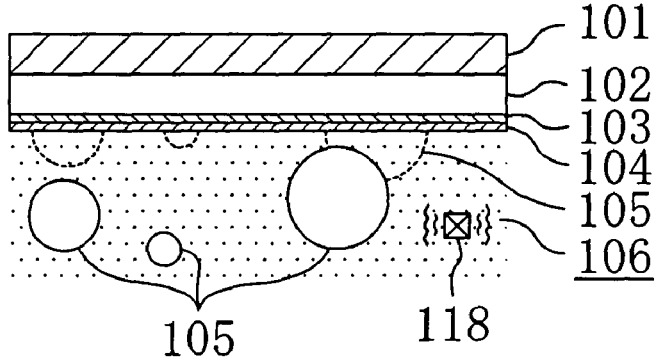
Figure 6C:
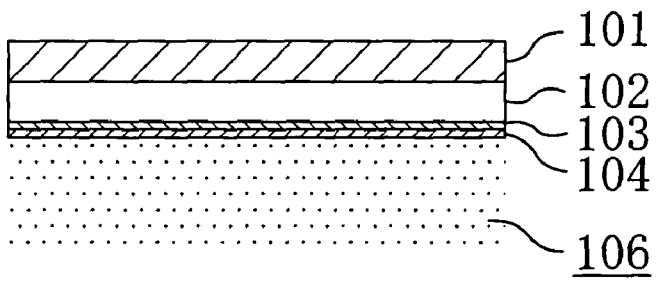

Thereafter, supersonic vibration is applied to the plating solution 106 by using the supersonic vibration generator 118, while leaving the surface of the Cu seed film 104 immersed in the plating solution 106, as shown in FIG. 6C. The step shown in FIG. 6C (bubble removing step), which is characteristic of the present embodiment, allows the removal of the bubbles 105 adsorbed to the surface of the Cu seed film 104. At this time, the effect of removing the bubbles 105 can further be enhanced by performing the same high-speed-wafer debubbling step as performed in the first to third embodiments, i.e., by rotating the substrate 101 held by the substrate holding mechanism at a high speed. In FIGS. 6B and 6C, the bubbles 105 are depicted under magnification for easy understanding of the description.

Figure 6E:
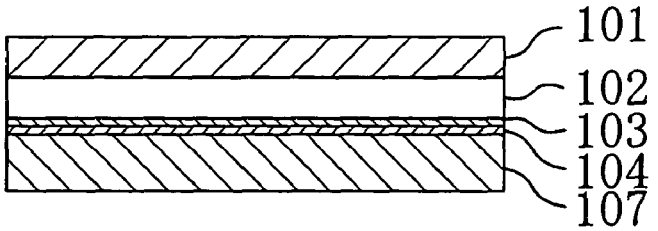

Subsequently, as shown in FIG. 6D, a Cu plate film 107 is grown gradually on the Cu seed film 104 by performing a normal plating process with respect to the substrate 101. FIG. 6E shows the state in which plating growth for the Cu plate film 107 has been performed completely.

Thus, according to the fourth embodiment, supersonic vibration is applied to the plating solution 106 in which the substrate 101 is immersed before the plating process is initiated so that the small bubbles 105 adsorbed to the substrate 101 are removed. This circumvents the formation of pit-type defects or voids in the Cu plate film 107 resulting from the adsorption of the bubbles 105 and thereby allows the fabrication of a high-reliability electronic device less likely to suffer an inter-wire short circuit.

When the bubble removing step is performed in the fourth embodiment, the plating solution 106 is preferably convected (circulated). The arrangement allows more positive washing away of the bubbles 105 from the surface of the substrate 101.

If an electrode containing Cu as a main component is used as an anode electrode attached to the plating bath in which the plating solution 106 is reserved in the fourth embodiment, particles may be generated from the anode electrode by the application of supersonic vibration to the plating solution 106. To prevent this, a material which is substantially insoluble in the plating solution 106, e.g., platinum or the like is used preferably as the material of the anode electrode. In this case, however, an additional supply of a Cu component to the plating solution 106 is needed to compensate for a reduction in the Cu concentration of the plating solution 106 caused by the Cu plating process.

In the fourth embodiment, it is preferable to supply, e.g., pure water to the surface of the Cu seed film 104 to be plated before the substrate 101 is brought into contact with the plating solution 106 in the same manner as in the second embodiment and thereby improve the wettability of the surface to be plated. At this time, it is more preferable to supply, e.g., supersonic vibration to the pure water in the same manner as in the third embodiment and thereby remove the particles adhered to the surface to be plated. As for larger bubbles formed upon the spraying of the pure water onto the surface of the Cu seed film 104, they can be removed together with the smaller bubbles 105 adsorbed to the surface of the Cu seed film 104 by using the supersonic vibration generator 118 according to the present embodiment.

In the fourth embodiment, a voltage need not be applied to each of the electrodes in the bubble removing step based on supersonic application. In other words, a voltage (plating current) need not be applied to the Cu seed film 104. However, the bubble removing step may also be performed, while applying a weak voltage to the substrate 101, to prevent the thin Cu seed film 104 (especially the portion thereof formed with the depressed portion) from being dissolved in the plating solution 106 during the bubble removing step. In this case, the voltage applied to the substrate 101 preferably has a magnitude such that the density of the plating current in the substrate 101 is in the range of 0.1 to 5.0 mA/cm$^2$. The normal density of the plating current in the substrate during the plating process is normally about 10 mA/cm$^2$ or more.

The fourth embodiment has also brought the substrate 101 into contact with the plating solution 106 and subsequently performed the bubble removing step based on supersonic application. If supersonic vibration presents a problem to the filling of the plate film in an extremely small opening (e.g., at least that one of the depressed portions present in the surface to be plated which has a minimum diameter), it is also possible to bring the substrate 101 into contact with the plating solution 106, fill the plate film in the extremely small opening, and then perform the bubble removing step. The arrangement permits each of the filling of the plate film into the extremely small opening such as an extremely small hole and the removal of bubbles to be performed. At this time, the thickness of the plate film required to fill up the extremely small opening is 0.08 μm or less if the diameter of the extremely small opening is, e.g., 0.16 μm. The thickness of the plate film required to fill up the extremely small opening is preferably 20% or less of the final thickness (target thickness) of the plate film at the time at which plating growth is completed.

Although the fourth embodiment has described the case where the plate film for wiring made of Cu is formed, it will easily be appreciated that the present embodiment is also applicable to the case where a plate film made of another material is formed for a different application.

EMBODIMENT 5

An apparatus for plating a substrate according to the fifth embodiment of the present invention will be described with reference to the drawings.

Figure 7A:
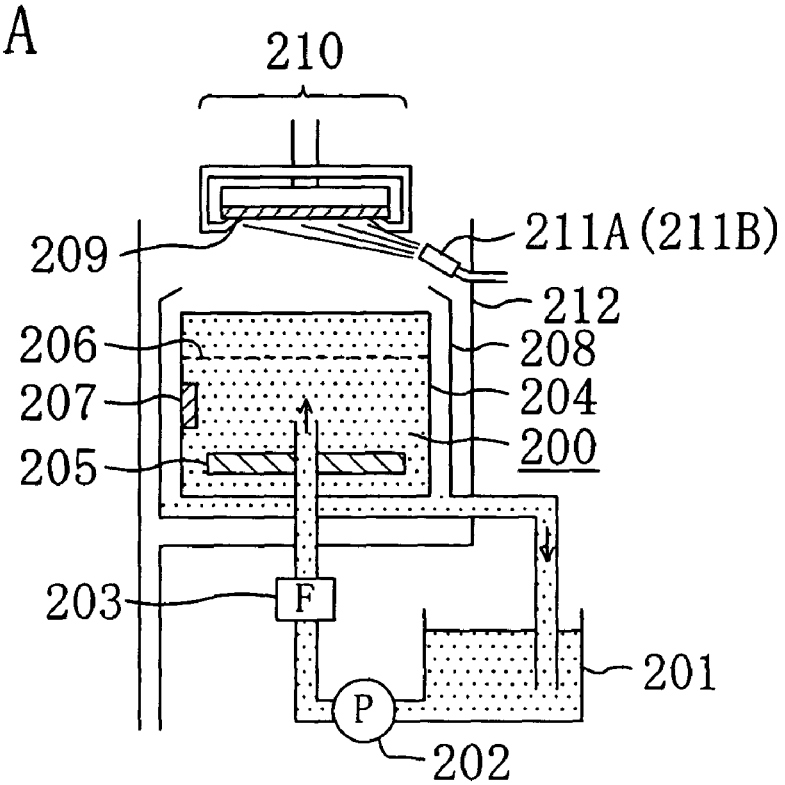
FIGS. 7A and 7B are schematic diagrams showing a structure of an apparatus for plating a substrate according to a fifth embodiment of the present invention.
Figure 7B:
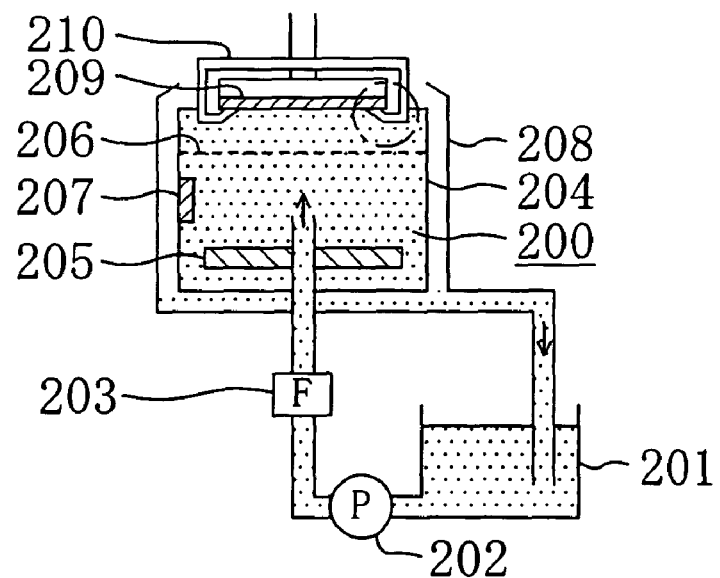

FIGS. 7A and 7B are schematic diagrams showing a structure of the apparatus for plating a substrate according to the fifth embodiment, of which FIG. 7A shows the state before a substrate is immersed in a plating solution and FIG. 7B shows the state after the substrate is immersed in the plating solution.

As shown in FIGS. 7A and 7B, the plating apparatus according to the present embodiment has a plating solution tank 201 for reserving a plating solution 200. The plating solution 200 is fed from the plating solution tank 201 to a plating bath 204 through a pump 202 and a filter 203.

An anode electrode 205 and a straightening plate 206 are disposed in the plating bath 204. The present embodiment has a characteristic in that a supersonic vibration generator 207 for applying supersonic vibration to the plating solution 200 is disposed in the plating bath 204. On the other hand, a plating solution recovery tank 208 is provided outside the plating bath 204 so that the plating solution 200 overflown from the plating bath 204 is returned to the plating solution tank 201 to be used repeatedly. Thus, the plating apparatus according to the present embodiment has a plating solution circulating mechanism for circulating the plating solution 200 between the plating solution tank 201 and the plating bath 204.

A substrate holding mechanism 210 for holding a substrate 209 and immersing the substrate 209 in the plating solution 200 reserved in the plating bath 204 such that the surface thereof to be plated faces downward is provided above the plating bath 204. The substrate holding mechanism 210 is capable of rotating the substrate 209 with the substrate 209 being held thereby.

Figure 8:
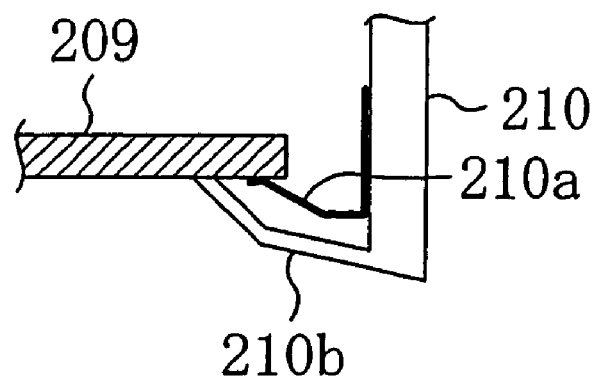
FIG. 8 is an enlarged view of a portion of a substrate holding mechanism for supporting a substrate in the apparatus for plating a substrate according to the fifth embodiment.

FIG. 8 is an enlarged view of the portion of the substrate holding mechanism 210 supporting the substrate 209. As shown in FIG. 8, the substrate holding mechanism 210 is provided with a cathode electrode 210a for contacting the surface of the substrate 209 to be plated and a seal 210b for contacting the surface of the substrate 209 to be plated in such a manner as to protect the cathode electrode 210a from the plating solution 200. Thus, as shown in FIG. 7B, plating growth can be performed by applying a voltage between the anode electrode 205 and the cathode electrode 210a with the substrate 209 being immersed in the plating solution 200 reserved in the plating bath 204, i.e., by applying a voltage between the anode electrode 205 and the surface of the substrate 209 to be plated (e.g., the surface of a Cu seed layer). The present embodiment has another characteristic in that the portion of the seal 210b supporting the substrate 209 is not in vertical positional relation with the surface of the substrate 209 to be plated but in tilted relation therewith. In other words, the contact angle of the seal 210b relative to the surface of the substrate 209 to be plated is in a range larger than 90° when viewed from the center of the substrate 209, preferably in a rage not less than 120° and not more than 150°.

The plating apparatus according to the present embodiment has still another characteristic in that a supersonic-vibration-applied cleaning liquid nozzle 211A capable of supplying a cleaning liquid, such as pure water, applied with supersonic vibration to the surface of the substrate 209 to be plated is provided outside the plating bath 204. Instead of the nozzle 211A capable applying supersonic vibration, a cleaning liquid nozzle 211B capable of supplying a cleaning liquid in a normal state may also be provided. A waste cleaning liquid recovery tank 212 for recovering the used cleaning liquid is also provided outside the plating bath 204 (to be precise, outside the plating solution recovery tank 208). In FIG. 7B showing the state after the substrate 209 is immersed in the plating solution 200, the depiction of the nozzle 211A or 211B and the waste cleaning liquid recovery tank 212 is omitted.

A description will be given herein below to the effects resulting from the individual characteristics of the present embodiment.

In the present embodiment, the supersonic vibration generator 207 for applying supersonic vibration to the plating solution 200 is disposed in the plating bath 204. The arrangement allows easy removal of extremely small bubbles each having a size of several micrometers or less and adsorbed to the substrate 209 when the substrate 209 held by the substrate holding mechanism 210 is immersed in the plating solution 200 reserved in the plating bath 204.

Figure 9:
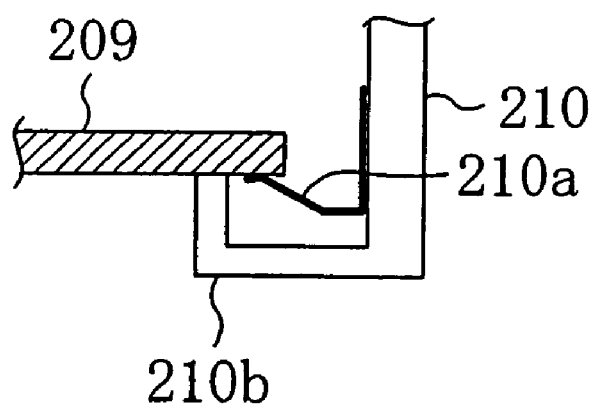
FIG. 9 is an enlarged view when the portion of the substrate holding mechanism for supporting a substrate in the apparatus for plating a substrate according to the fifth embodiment is composed of a conventional structure.
Figure 10A:
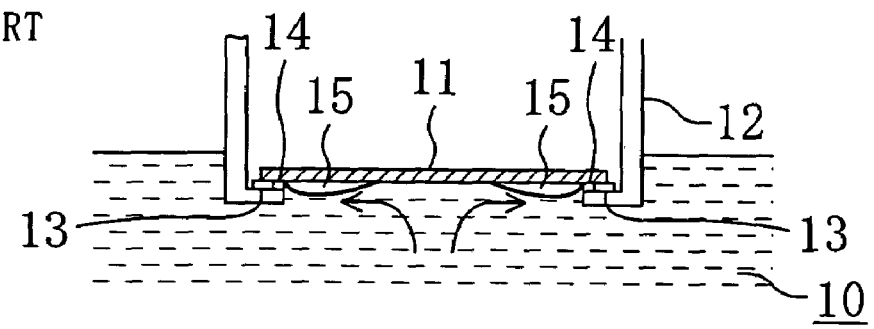
FIGS. 10A to 10C are schematic diagrams illustrating the individual process steps of a conventional method for plating a substrate.
Figure 10B:
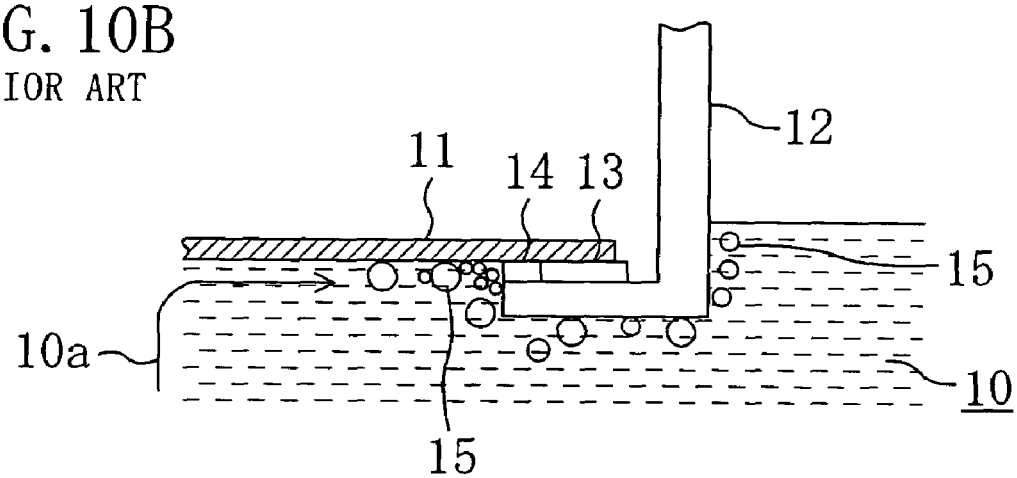
Figure 10C:
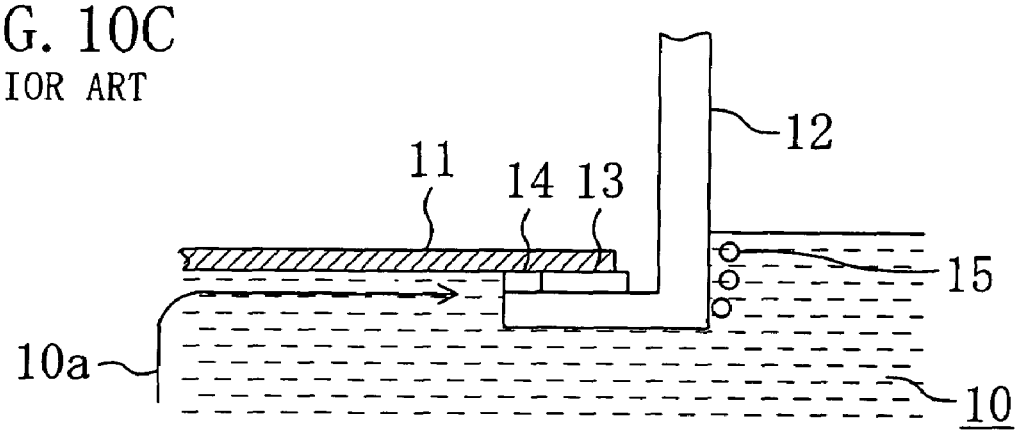
Figure 11A:
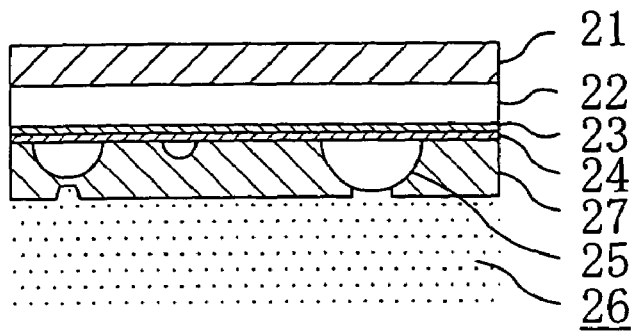
FIGS. 11A and 11B are views for illustrating a problem encountered in the conventional method for plating a substrate.
Figure 11B:
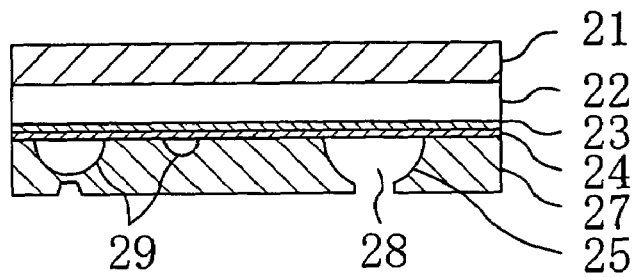
Figure 12A:
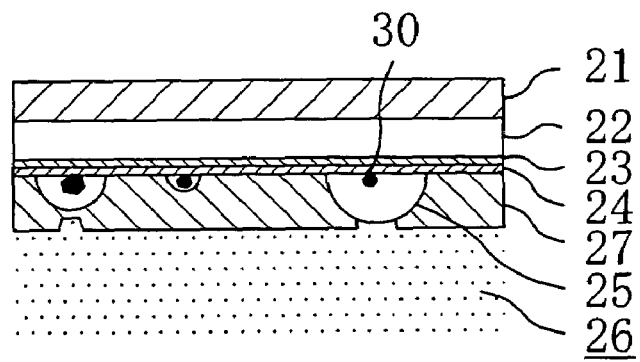
FIGS. 12A and 12B are views for illustrating another problem encountered in the conventional method for plating a substrate.
Figure 12B:
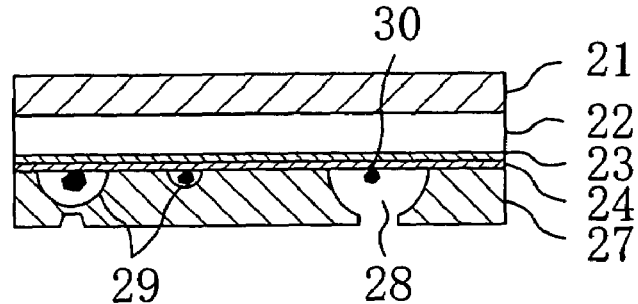
Figure 13A:
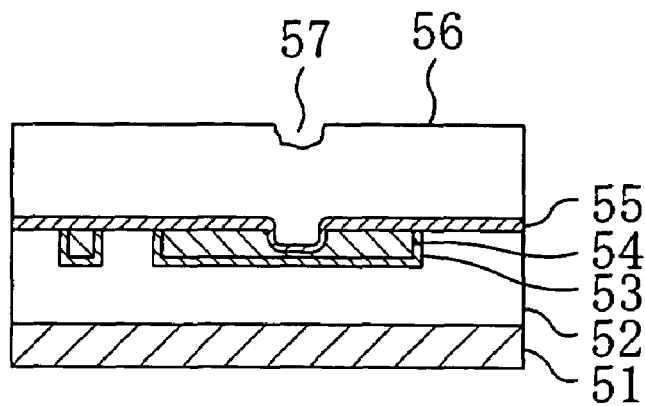
FIGS. 13A to 13C are views for illustrating still another problem encountered in the conventional method for plating a substrate.
Figure 13B:
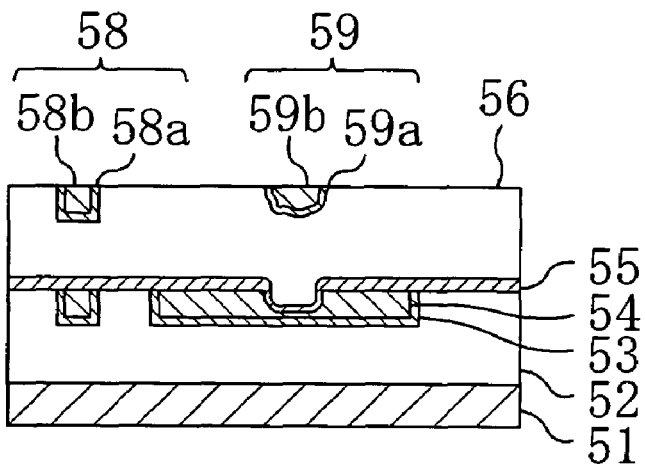
Figure 13C:
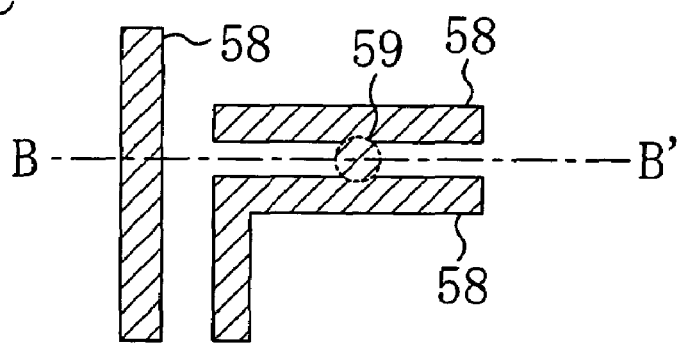

In the present embodiment, as shown in FIG. 8, the contact angle of the seal 210b relative to the surface of the substrate 209 to be plated is larger than 90°. If the contact angle of the seal 210b relative to the surface of the substrate 209 to be plated is 90°, as in the conventional structure shown in FIG. 9, i.e., if the portion of the seal 210b supporting the substrate 209 is in perpendicular contact with the surface of the substrate 209 to be plated, the following problem occurs. During the removal of the bubbles adsorbed to the surface of the substrate 209, e.g., some of the bubbles washed away by the plating solution 200 stagnate at a corner portion resulting from the contact between the seal 210b and the substrate 209. As a result, the bubbles cannot be removed satisfactorily from the surface of the substrate 209 to be plated. In the present embodiment, by contrast, the contact angle of the seal 210b relative to the surface of the substrate 209 to be plated is larger than 90° and the contact portion between the seal 210b and the substrate 209 is configured to have a gradually widening bottom, as shown in FIG. 8. Therefore, the bubbles washed away to the outside of the surface of the substrate 209 to be plated, by the rotation of the substrate holding mechanism 210 or by the convection of the plating solution 200 in the plating bath 204 described in any of the first to third embodiments or by the application of supersonic vibration to the plating solution 200 described in the fourth embodiment, are prevented from stagnating at the contact portion (corner portion) between the seal 210b and the substrate 209, as observed conventionally. Consequently, the bubbles can be removed easily from the surface of the substrate 209 to be plated.

In addition, the nozzle 211A or 211B for supplying, e.g., pure water (or pure water applied with supersonic vibration) to the surface of the substrate 209 to be plated before the substrate 209 is immersed in the plating solution 200 reserved in the plating bath 204 is also provided in the present embodiment. The arrangement improves the wettability of the surface of the substrate 209 to be plated or removes particles adhered to the surface to be plated so that the number of bubbles adsorbed to the substrate 209 when the substrate 209 is immersed in the plating solution 200 is reduced significantly.

Referring to FIGS. 7A and 7B, a description will be given herein below to the operation of the plating apparatus according to the present embodiment in implementing the plating method according to each of the first to fourth embodiments.

First, the substrate 209 is placed in the substrate holding mechanism 210. Thereafter, the substrate 209 is brought into contact with the plating solution 200 reserved in the plating bath 204 by using the substrate holding mechanism 210 in the case of the first or fourth embodiment. In the case of the second or third embodiment, a preparatory process, which will be described later, is performed with respect to the substrate 209 and then the substrate 209 is brought into contact with the plating solution 200 in the same manner as in the first or fourth embodiment. For the preparatory process, an apparatus provided with a mechanism capable of spraying a liquid onto the substrate 209 (e.g., a cleaning liquid nozzle or the like) is used. Thereafter, the substrate 209 is rotated by using the substrate holding mechanism 210, while a voltage is applied to the substrate 209, whereby a plate film is formed. In the case of the first embodiment, the substrate 209 is rotated in the plating solution 200 at a revolution speed higher than that during the plating process by using the substrate holding mechanism 210 before a voltage for the plating process is applied. In the case of the fourth embodiment, supersonic vibration is applied to the plating solution 200 reserved in the plating bath 204 by using the supersonic vibration generator 207, while the substrate 209 is rotated in the plating solution 200 by using the substrate holding mechanism 210, before a voltage for the plating process is applied.

A description will be given to the preparatory process performed in the second or third embodiment.

In the second embodiment, pure water or the like, e.g., is ejected onto the substrate 209 by using the cleaning liquid nozzle 211B before the substrate 209 is brought into contact with the plating solution 200. In the third embodiment, pure water applied with supersonic vibration or the like, e.g., is ejected onto the substrate 209 by using the supersonic-vibration-applied cleaning liquid nozzle 211A. This achieves the effect of improving the wettability of the surface of the substrate 209 to be plated in each of the embodiments and further allows, in the third embodiment, the removal of the particles adhered to the surface of the substrate 209 which serve as nuclei in forming bubbles when the substrate 209 is brought into contact with the plating solution 200. If the substrate 209 is rotated or moved upward and downward by using the substrate holding mechanism 210 in the case of cleaning using the nozzle 211A or 211B in the second or third embodiment, the cleaning effect can further be enhanced. In the case where bubbles are adhered to the surface of the substrate 209 due to the ejection of a cleaning liquid such as pure water, the bubbles can be removed by rotating the substrate 209 in the plating solution 200 reserved in the plating bath 204 at a high speed before the plating process is initiated.

As described above, the plating apparatus according to the present embodiment allows the plating process to be performed with respect to the substrate 209 after the bubbles adsorbed to the surface of the substrate 209 are removed or in the state in which no bubble is adhered to the surface of the substrate 209. This prevents the formation of pit-type defects or voids in the plate film resulting from the adsorption of the bubbles and provides a uniform plate film. In the case where the plate film is, e.g., a conductive film for wiring, a high-reliability electronic device less likely to suffer an inter-wire short circuit can be fabricated.

In the present embodiment also, if an electrode containing Cu as a main component is used as an anode electrode 205 attached to the plating bath 204 in which the plating solution 200 is reserved, particles may be generated from the anode electrode 205 by the application of supersonic vibration to the plating solution 200, in the same manner as in the fourth embodiment. To prevent this, a material which is substantially insoluble in the plating solution 200, e.g., platinum or the like is used preferably as the material of the anode electrode 205. In this case, however, an additional supply of a Cu component to the plating solution 200 is needed to compensate for a reduction in the Cu concentration of the plating solution 200 caused by the Cu plating process.

Although the present embodiment has used the nozzle 211A or 211B to supply a liquid such as pure water to the surface of the substrate 209 to be plated, such a liquid supplying mechanism is not particularly limited.

Although the present embodiment has described the case where a plate film for wiring made of Cu is formed, it will easily be appreciated that the present embodiment is also applicable to the case where a plate film made of another material is formed for another application.

What is claimed is:

1. A method for plating a substrate comprising the steps of:
    performing a first electrolytic plating process with respect to the substrate in a plating solution until at least one of depressed portions provided in a surface to be plated having a minimum diameter is filled up;
    after the step of the first electrolytic plating process, rotating the substrate in the plating solution at a first speed of rotation and thereby removing a bubble adsorbed to the substrate; and
    after the step of removing the bubble, rotating the substrate in the plating solution at a second speed of rotation lower than the first speed of rotation and thereby performing a second electrolytic plating process with respect to the substrate,
    wherein the second electrolytic plating process is performed with the surface of the substrate to be plated faced downward and the substrate immersed in the plating solution, and
    a plate film is formed by the steps of the first and second electrolytic plating processes.

2. The method of claim 1, wherein the first speed of rotation is not less than 100 rpm and not more than 200 rpm.

3. The method of claim 1, wherein the second speed of rotation is not less than 10 rpm and not more than 60 rpm.

4. The method of claim 1, wherein a current density applied to the substrate in the step of removing the bubble is lower than a current density applied to the substrate in the step of performing the second electrolytic plating process with respect to the substrate.

5. The method of claim 1, further comprising, prior to the step of removing the bubble, the step of:
    forming a seed layer on the surface of the substrate to be plated, wherein
    the step of removing the bubble includes the step of preventing the seed layer from being dissolved in the plating solution.

6. The method of claim 1, wherein the bubble has a size of 10 µm or less.

7. The method of claim 1, wherein
    the substrate is held in the plating solution by a substrate holding mechanism having an electrode for contacting the surface to be plated and a seal for contacting the surface to be plated in such a manner as to protect the electrode from the plating solution and
    a contact angle of the seal relative to the surface to be plated is not less than 120° and not more than 150°.

8. The method of claim 1, wherein the step of removing the bubble includes the step of applying supersonic vibration to the plating solution.

9. The method of claim 1, wherein a thickness of a part of the plate film formed in the step of the first electrolytic plating process and necessary to fill up the depressed portion having the minimum diameter is 20% or less of a target thickness of the plate film.

10. The method of claim 1, further comprising, prior to the step of removing the bubble, the step of:
    immersing the substrate in the plating solution, while rotating the substrate at the first speed of rotation or at a third speed of rotation higher than the second speed of rotation.

11. The method of claim 1, further comprising, prior to the step of removing the bubble, the step of:
    improving a wettability of the surface to be plated before immersing the substrate in the plating solution.

12. The method of claim 11, wherein the step of improving the wettability includes the step of supplying a liquid to the surface to be plated.

13. The method of claim 11, wherein the step of improving the wettability includes the step of removing a particle adhered to the surface to be plated.

14. The method of claim 13, wherein the step of removing the particle includes the step of applying supersonic vibration to the surface to be plated.

15. The method of claim 13, wherein the step of removing the particle includes the step of supplying a liquid to which supersonic vibration has been applied to the surface to be plated.

16. A method for manufacturing semiconductor device comprising the steps of:

performing a first electrolytic plating process with respect to a substrate in a plating solution until at least one of depressed portions provided in a surface to be plated having a minimum diameter is filled up;

after the step of the first electrolytic plating process, rotating the substrate in the plating solution at a first speed of rotation and thereby removing a bubble adsorbed to the substrate; and after the step of removing the bubble, rotating the substrate in the plating solution at a second speed of rotation lower than the first speed of rotation and thereby performing a second electrolytic plating process with respect to the substrate, wherein the second electrolytic plating process is performed with the surface of the substrate to be plated faced downward and the substrate immersed in the plating solution, and a plate film is formed through the steps of the first and second electrolytic plating processes.

* * * * *